United States Patent
Lee et al.

(10) Patent No.: US 7,313,050 B2
(45) Date of Patent: Dec. 25, 2007

(54) WORD-LINE DRIVER FOR MEMORY DEVICES

(75) Inventors: Cheng Hung Lee, Hsin-chu County (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 53 days.

(21) Appl. No.: 11/406,984

(22) Filed: Apr. 18, 2006

(65) Prior Publication Data

US 2007/0242555 A1   Oct. 18, 2007

(51) Int. Cl.
*G11C 8/00*   (2006.01)

(52) U.S. Cl. .............................. 365/230.06; 365/185.23

(58) Field of Classification Search ........... 365/230.06, 365/230.08, 226, 189.09, 189.11, 185.23, 365/185.24
See application file for complete search history.

(56) References Cited

U.S. PATENT DOCUMENTS

| | | | |
|---|---|---|---|
| 5,252,863 A * | 10/1993 | Hatsuda et al. | 326/97 |
| 6,038,191 A * | 3/2000 | Fukuhara et al. | 365/229 |
| 6,449,192 B2 * | 9/2002 | Otsuka | 365/185.23 |
| 6,744,676 B2 * | 6/2004 | Leung et al. | 365/189.09 |
| 7,248,535 B2 * | 7/2007 | Chun | 365/230.03 |

* cited by examiner

*Primary Examiner*—Gene N. Auduong
(74) *Attorney, Agent, or Firm*—K & L Gates LLP

(57) ABSTRACT

A word-line driver has an input from a word-line decoder and an output to drive a word-line. The word-line driver comprises a plurality of inverters connected in series between the input and output including a first and a second inverter with a first node designating an output of the first inverter and an input of the second inverter, the first inverter having a NMOS transistor with a controllable first source, and a first pull-up circuitry coupled between a positive supply voltage and the first node and selectively activated by a first control signal, wherein when the first source is set to the positive supply voltage and the first control signal is set to a complementary supply voltage of the positive supply voltage, the first node is pulled up to the positive supply voltage to ensure an output of the second inverter is pulled down to the complementary supply voltage.

12 Claims, 4 Drawing Sheets

WORD-LINE DRIVER FOR MEMORY DEVICES

BACKGROUND

The present invention relates generally to semiconductor memory designs, and, more particularly, to a memory word-line driver design.

The core of a semiconductor memory comprises at least one two-dimensional memory cell array, where information is stored. Traditionally, word-lines select rows, which activate cells, and bit-lines select columns, which access, i.e., read or write, the cells. When a word-line and a bit line are activated, a particular memory cell connected to them is selected.

To activate a word-line, its voltage is normally set to a high voltage, which is equal to a positive supply voltage in a CMOS circuitry. Setting word-line to a low voltage, which is a voltage complimentary to the positive supply voltage, de-activates the word-line. While the low voltage is customarily set to ground, or 0 V, the value for the high voltage can be different for various semiconductor manufacturing technologies. For instance, in a deep-sub-micron technology, a high voltage can be 1.2 V or even lower, while in a sub-micron technology the high voltage can be 2.5 V. But for a given memory chip and a given technology, the high voltage is normally designed to a fixed value, and this is particularly true for a complimentary-metal-oxide-semiconductor (CMOS) memory circuitry.

Since there are multiple memory cells connected to a single word-line, and word-line itself can be very long depending on the memory array size and technology used, so the word-line can be quite a load for its corresponding decoder, then a driver is needed to drive the word-line. The word-line driver couples, on one end, to a word-line decoder output, and on the other end, to a word-line. When a memory chip is in an active mode, i.e., the memory chip is ready for being actively read or written, the word-line driver functions just as a regular driver, following the word-line decoder, and providing a current source to pull up the word-line to a high voltage when the word-line is selected, and pull down the word-line to a low voltage when the word-line is not selected. When the memory chip is in a standby mode, i.e., the memory can not be actively read or written, and the power consumption is maintained at a minimum just to retain the information stored in the memory cell arrays, then the word-line driver clamps the word-line voltage to low. Besides, it is desirable for the word-line driver to have lower stand-by power consumption.

What is needed is an improved word-line driver design with reduced leakage and reduced layout area.

SUMMARY

In view of the foregoing, a word-line driver design for use in semiconductor memories is disclosed.

According to one embodiment of the present invention, a word-line driver has an input from a word-line decoder and an output to drive a word-line. The word-line driver comprises a plurality of inverters connected in series between the input and output including a first and a second inverter with a first node designating an output of the first inverter and an input of the second inverter, the first inverter having a NMOS transistor with a controllable first source, and a first pull-up circuitry coupled between a positive supply voltage and the first node and selectively activated by a first control signal, wherein when the first source is set to the positive supply voltage and the first control signal is set to a complementary supply voltage of the positive supply voltage, the first node is pulled up to the positive supply voltage to ensure an output of the second inverter is pulled down to the complementary supply voltage.

The construction and method of operation of the invention, however, together with additional objects and advantages thereof will be best understood from the following description of specific embodiments when read in connection with the accompanying drawings.

DESCRIPTION

Figure 1:
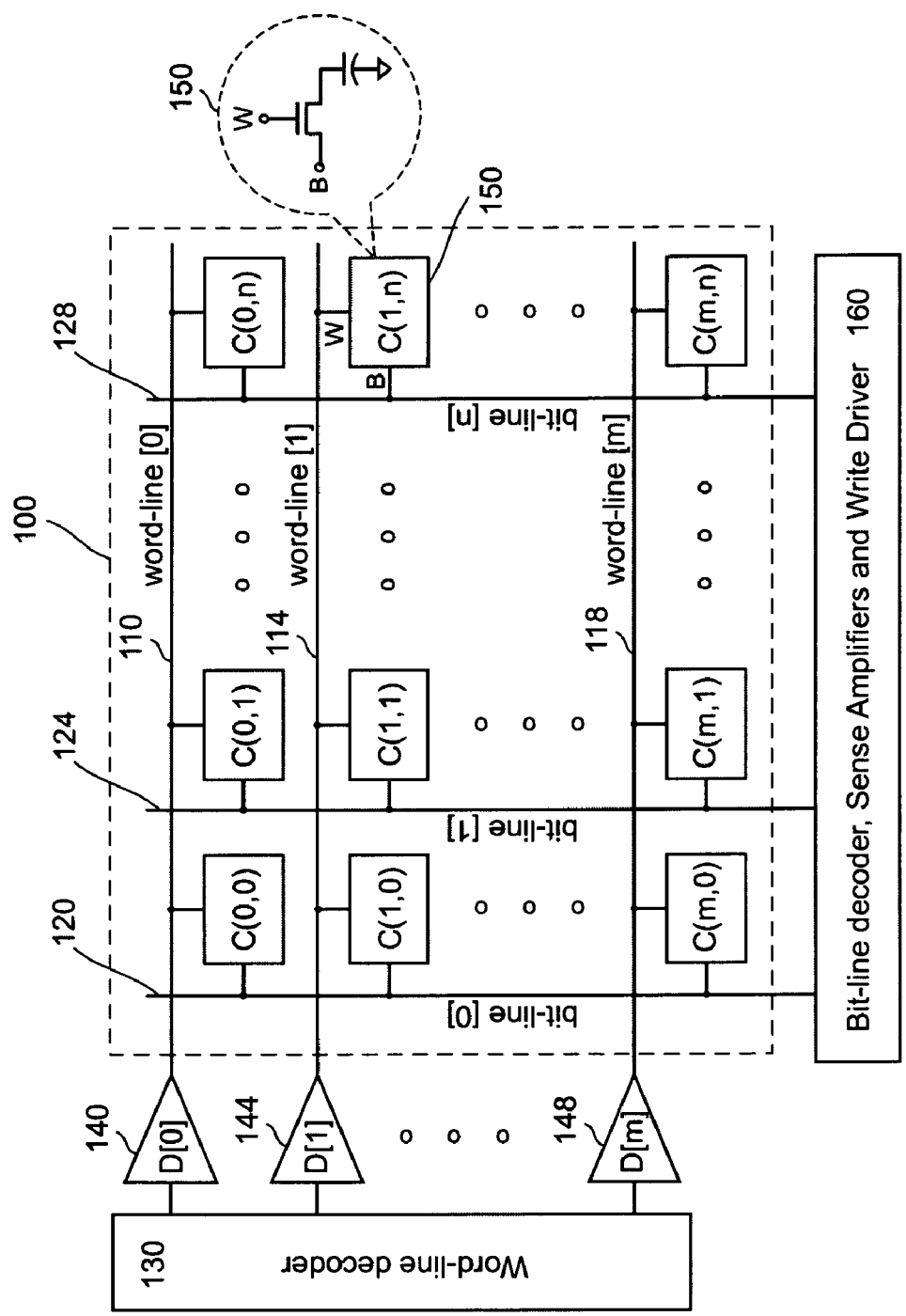
FIG. 1 illustrates a memory array with word-line drivers.

FIG. 1 illustrates a memory core array 100 with m+1 number of rows and n+1 number of columns of memory cells. These rows of cells are selected by m+1 number of word-lines [0:m] 110~118, while the columns are selected by n+1 number of bit-lines [0:n] 120~128. The word-lines [0:m] 110~118 are driven by word-line decoder 130 through their corresponding drivers D[0:m] 140~148. When a word-line is set to a high voltage, all the cells connected to the word-line will be selected. But which memory cell is accessed, i.e. read or written, also depends on which bit-line is selected. For instance, if word-line[1] 114 and bit-line[n] 128 are both selected, the cell C(1, n) 150 is accessible or selected. The bit-lines [0:n] 120~128 connects to bit-line-decoder-sense-amplifiers-and-write-driver 160, for read or write selected memory cells.

An exemplary dynamic random access memory (DRAM) cell 150 is shown for cell C(1,n), but the word-line driver design of the present invention is not limited to just DRAMs, in fact, it can be readily applied to other memories as well, such as static random access memory (SRAM) and non-volatile memories.

For purpose of this application, two supply voltages are normally used: a positive supply voltage (e.g., Vcc) and its complementary supply voltage (e.g., Vss or GND). A CMOS circuitry always operates from rail to rail with Vcc as an upper rail and Vss as a lower rail.

Figure 2:
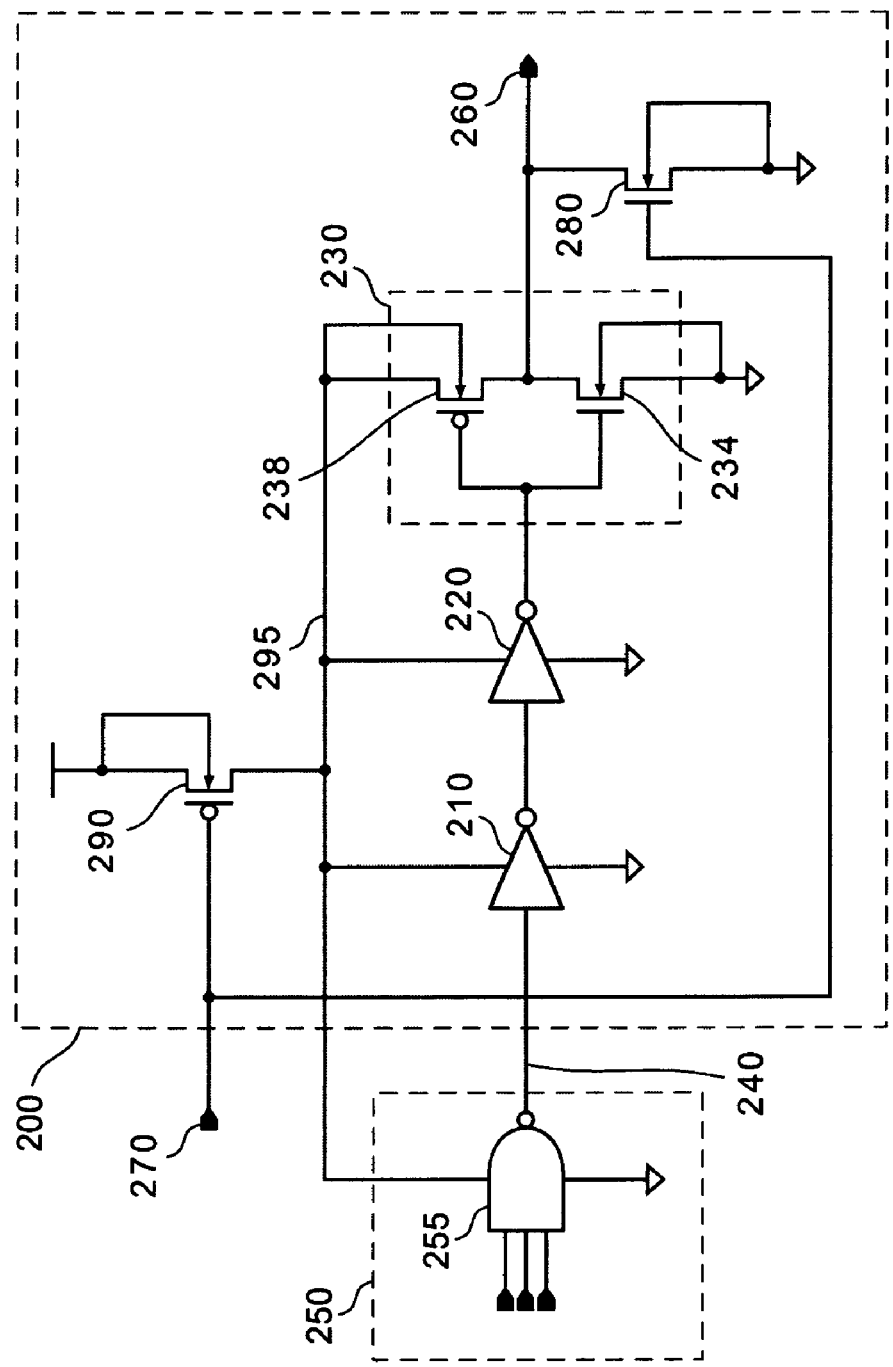
FIG. 2 is a schematic showing a prior art word-line driver.

FIG. 2 is an electrical schematic showing a prior art word-line driver 200. The driving portion of the word-line driver comprises three inverters 210, 220 and 230, connected in series. The input of the driver 200 connects to an output of a word-line decoder 250 at a node 240. An output node 260 of the driver 200 connects to a word-line. The inverter 230 is drawn with two discrete transistors, NMOS 234 and PMOS 238 connected in a traditional CMOS inverter style, just to show the structure of the inverter. The other inverters 210 and 220 have exactly the same structure as inverter 230.

Referring to FIG. 2, the purpose of adding two transistors, a NMOS 280 and a PMOS 290 is to clamp the output node 260 of the driver 200 to the Vss, when a memory chip employing the word-line driver 200 is in a standby mode. To achieve this clamping object, node 270 is set to the Vcc, which turns on the NMOS transistor 280 to pull the node 260 to the Vss, which turns off the PMOS transistor 290 to shut off a pull-up current path through the PMOS transistors 290 and 238 to the node 260.

During chip active mode, the node 270 voltage stays at the Vss to turn off the NMOS transistor 280, while it saturates the PMOS transistor 290, which pull up the node 295 to a virtual Vcc, so that the two transistors, the NMOS transistor 280 and PMOS transistor 290, do not interfere with normal operations of the driver 200.

Unfortunately, in a real silicon, these transistors cannot be completely shut off, there are always leakages, and this kind of driver design as shown in FIG. 2 is particularly prone to the leakage problem, as transistors 290 and 238 are close to the end stage of the word-line driver and their sizes are relatively large, and so are their leakage current. Together with the turned-on transistor 280, transistors 290 and 238 form a large leakage path during the chip standby mode.

Figure 3:
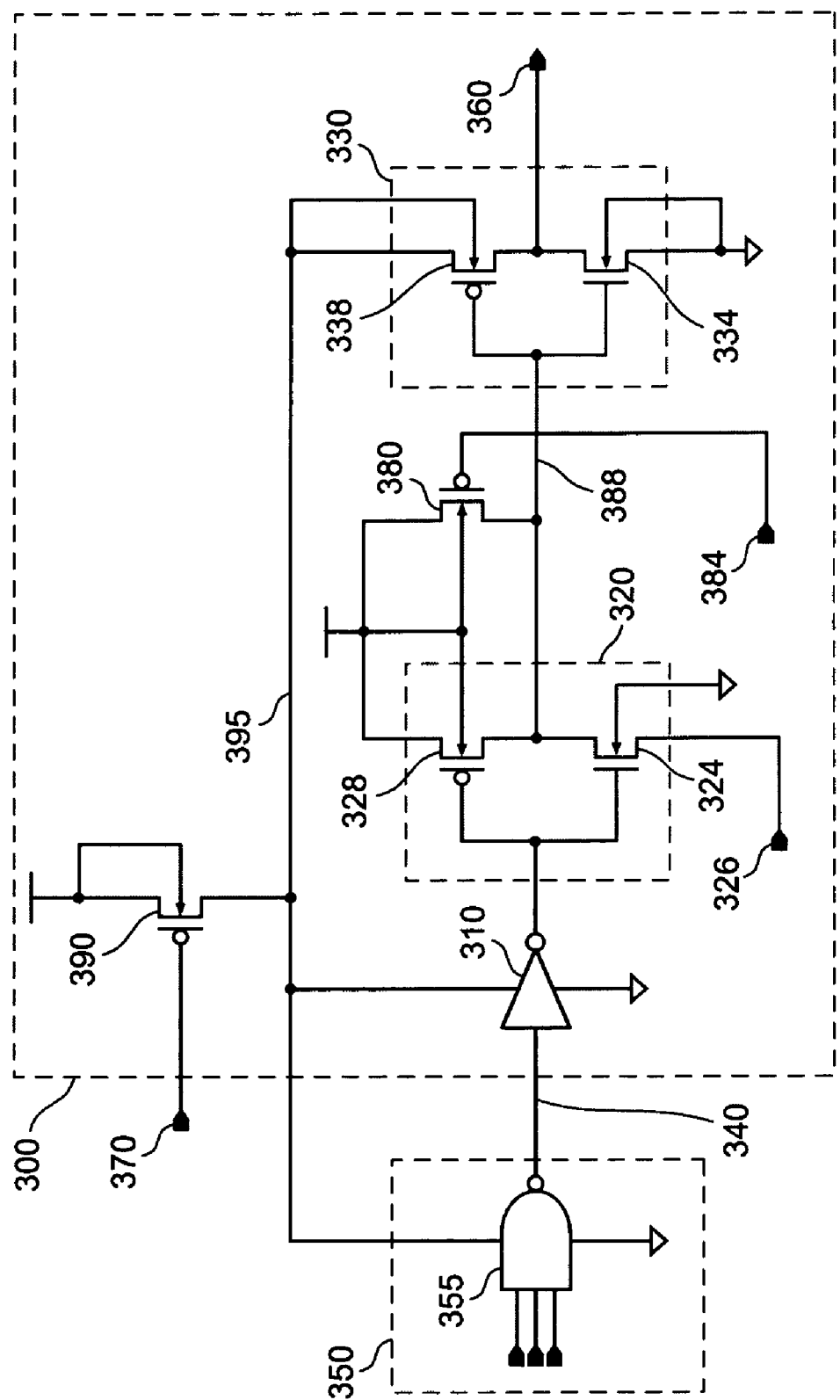
FIG. 3 is a schematic showing a word-line driver according to one embodiment of the present invention.

FIG. 3 is a schematic showing a modified word-line driver 300 according to one embodiment of the present invention. Driving portion of the word-line driver 300 also has three inverters 310, 320 and 330 connected in series. The input of the driver 300 connects to the output of word-line decoder 350 at a node 340. The output of the driver 300 connects to a word-line at a node 360. Here the source of a NMOS transistor 324 in the inverter 320 is controllable. Also a pull-up PMOS transistor 380 is used in front of the last stage inverter 330 to pull the input of the inverter 330 up to the Vcc, so that the output of the inverter 330, or the node 360 is pulled down when a gate of the pull-up PMOS transistor 380 (node 384) is set to the Vss.

So during the standby mode, nodes 370 and 326 are set to the Vcc, so that the PMOS transistor 390 and NMOS transistor 324 are turned off. At the same time the node 384 is set to the Vss, so that the PMOS transistor 380 is turned on, which pulls up a node 388 to the Vcc. When the node 388 is high, the driver output 360 is low then, so that the goal of clamping the word-line to the Vss during standby mode is achieved.

During the active mode, the nodes 370 and 326 voltages stay low, so that PMOS transistor 390 is always on, and NMOS transistor 324 is in normal operation mode. The node 384 stays high, so that the PMOS transistor 380 is turned off. Then the driver 300 functions essentially as a three-stage-inverter-driver.

Here the clamping PMOS transistor 380 is not connected to the last stage inverter, so that its size can be smaller than the NMOS transistor 280 in the case of last stage clamping as shown in FIG. 2. The standby leakage current of the driver 380 is reduced compared to the prior art driver 200 as shown in FIG. 2.

Figure 4:
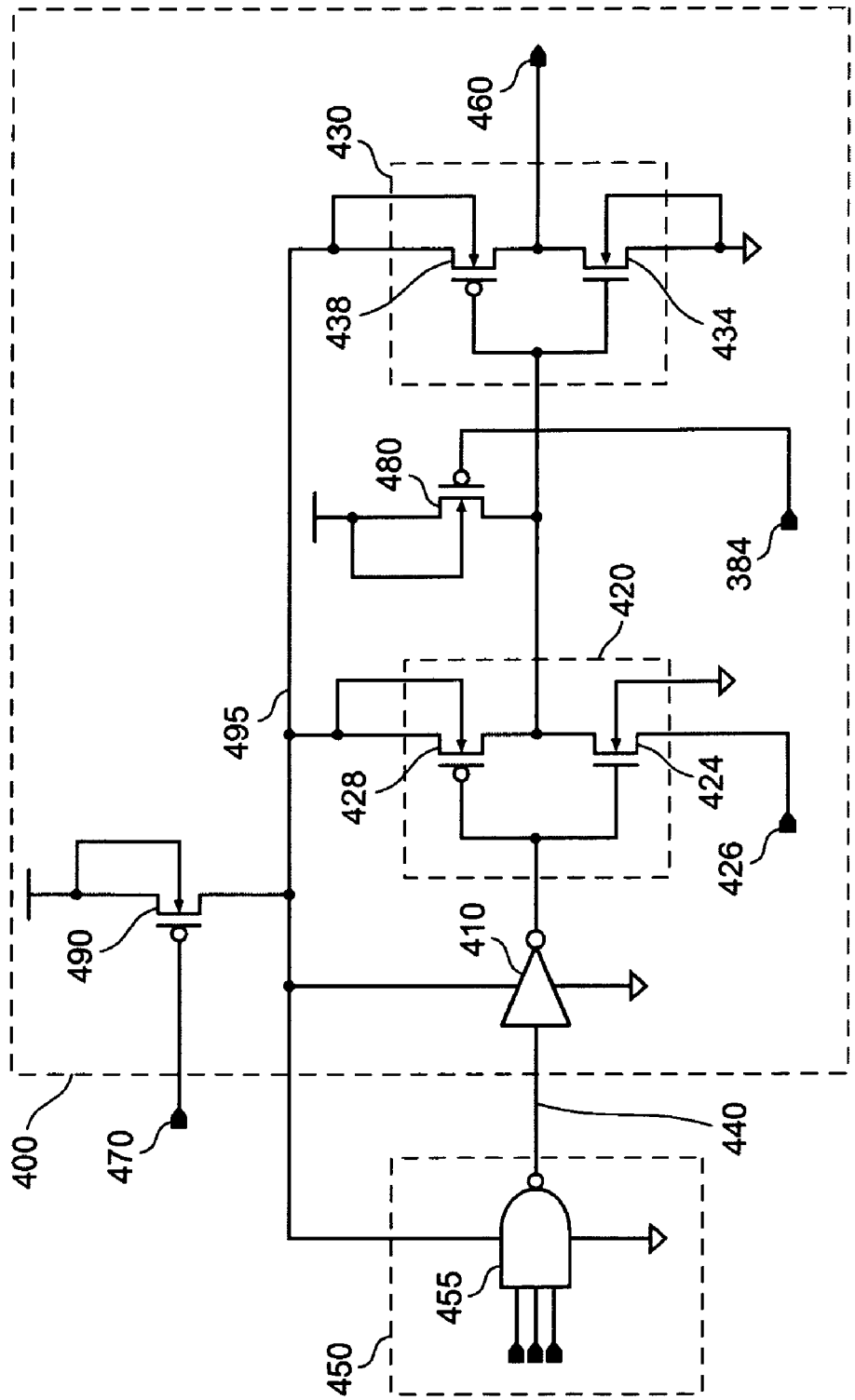
FIG. 4 is a schematic showing a word-line driver according to another embodiment of the present invention.

FIG. 4 is a schematic showing an alternative word-line driver according to another embodiment of the present invention. The word-line driver shown in FIG. 4 is identical to the word-line driver shown in FIG. 3, except the source and bulk of the PMOS transistor 428 in the inverter 420 are connected to the drain of the pull-up PMOS transistor 490, instead of being connected directly to the Vcc as in the case shown in FIG. 3. Both drivers 300 and 400 operate essentially the same.

Referring to FIGS. 2 through 4, all three word-line decoders 250, 350 and 450 are NAND gate type decoders, i.e., when a word-line is selected, its corresponding decoder output (240, 340 or 440) is low, so that an odd number of inverter stages are needed. Drivers 200, 300 and 400 all have three stages.

As illustrated above, the word-line is ensured to be pulled down by the above design with appropriate control signals and pull-up circuitries. It is understood that a complementary design can be devised with pull-down circuitries used with appropriately adjusted control signals to provide a high signal from an inverter immediately coupled to the pull-down circuitry, and with the help from an additional inverter added to the inverter series, the word-line can still be ensured to be pulled down for its operation.

This invention provides many different embodiments, or examples, for implementing different features of the invention. Specific examples of components and methods are described to help clarify the disclosure. These are, of course, merely examples and are not intended to limit the disclosure from that described in the claims.

What is claimed is:

1. A word-line driver with an input from a word-line decoder and an output to drive a word-line, the word-line driver comprising:
   a plurality of inverters connected in series between the input and output including a first and a second inverter with a first node designating an output of the first inverter and an input of the second inverter, the first inverter having a NMOS transistor with a controllable first source;
   a first pull-up circuitry coupled between a positive supply voltage (Vcc) and the first node and selectively activated by a first control signal; and
   a second pull-up circuitry coupled between the positive supply voltage and a source of a PMOS transistor of the second inverter, and selectively activated by a second control signal,
   wherein when the first source is set to the positive supply voltage and the first control signal is set to a complementary supply voltage (Vss) of the positive supply voltage, the first node is pulled up to the positive supply voltage to ensure an output of the second inverter is pulled down to the complementary supply voltage, and
   wherein when the second pull-up circuitry is not activated, a current path through the PMOS transistor in the second inverter is turned off.

2. The word-line driver of claim 1, wherein the first pull-up circuitry further comprises at least one PMOS transistor with a drain coupled to the first node, a source coupled to the positive supply voltage, and its gate coupled to the first control signal.

3. The word-line driver of claim 1, wherein the second pull-up circuitry comprises at least one PMOS transistor with a source coupled to the positive supply voltage and a gate coupled to the second control signal.

4. The word-line driver of claim 1, further comprising an even number of inverters connected in series, and coupled between an output of the second inverter and the word-line.

5. The word-line driver of claim 1, wherein the plurality of inverters includes an odd number of inverters connected in series between the input and an input of the first inverter if the word-line decoder outputs the Vss voltage when being selected.

6. The word-line driver of claim 1, wherein the plurality of inverters includes an even number of inverters connected in series between the input and an input of the first inverter if the word-line decoder outputs the Vcc voltage when being selected.

7. A word-line driver with an input from a word-line decoder and an output to drive a word-line, the word-line driver comprising:
   a plurality of inverters connected in series between the input and output including a first and a second inverters with a first node designating an output of the first inverter and an input of the second inverter, the first inverter having a NMOS transistor with a controllable first source;

a first pull-up circuitry coupled between a positive supply voltage (Vcc) and the first node and selectively activated by a first control signal; and a second pull-up circuitry coupled between the positive supply voltage and both sources of PMOS transistors of the first and second inverters, and selectively activated by a second control signal, wherein when the first source is set to the positive supply voltage and the first control signal is set to a complementary supply voltage (Vss) of the positive supply voltage, the first node is pulled up to the positive supply voltage to ensure an output of the second inverter is pulled down to the complementary supply voltage, and wherein when the second pull-up circuitry is not activated, current paths through the PMOS transistors in both the first and second inverters are turned off.

8. The word-line driver of claim 7, wherein the first pull-up circuitry further comprises at least one PMOS transistor with a drain coupled to the first node, a source coupled to the positive supply voltage, and its gate coupled to the first control signal.

9. The word-line driver of claim 7, wherein the second pull-up circuitry comprises at least one PMOS transistor with a source coupled to the positive supply voltage and a gate coupled to the second control signal.

10. The word-line driver of claim 7, further comprising an even number of inverters connected in series, and coupled between an output of the second inverter and the word-line.

11. The word-line driver of claim 7, wherein the plurality of inverters includes an odd number of inverters connected in series between the input and an input of the first inverter if the word-line decoder outputs the Vss voltage when being selected.

12. The word-line driver of claim 7, wherein the plurality of inverters includes an even number of inverters connected in series between the input and an input of the first inverter if the word-line decoder outputs the Vcc voltage when being selected.

* * * * *